United States Patent [19]

Ludwig et al.

[11] 4,376,988

[45] Mar. 15, 1983

[54] METHOD AND CIRCUITRY ARRANGEMENT FOR REFRESHING DATA STORED IN A DYNAMIC MOS MEMORY

[75] Inventors: Volker Ludwig, Geretsried; Juergen Heitmann, Munich, both of Fed. Rep. of Germany

[73] Assignee: Siemens Aktiengesellschaft, Berlin & Munich, Fed. Rep. of Germany

[21] Appl. No.: 238,138

[22] Filed: Feb. 25, 1981

[30] Foreign Application Priority Data

Mar. 14, 1980 [DE] Fed. Rep. of Germany ......... 300987

[51] Int. Cl.³ .............................................. G11C 11/40
[52] U.S. Cl. .................................... 365/222; 365/189
[58] Field of Search ............... 365/222, 189, 230, 154, 365/174, 182

[56] References Cited

U.S. PATENT DOCUMENTS 4,158,891 6/1979 Fisher .................................. 365/222

Primary Examiner—Terrell W. Fears
Attorney, Agent, or Firm—Hill, Van Santen, Steadman, Chiara & Simpson

[57] ABSTRACT

The invention concerns a method and circuitry for refreshing data stored in a dynamic MOS memory. The refreshing processes proceed independently of data handling in the memory. The duration between successive two refreshing processes is selected such that it is smaller than a predetermined maximum duration by a duration which is associated with a memory process. When during a refreshing process, a reading process is to be executed, the reading process is delayed by means of inserted holding cycles. During execution of memory processes, the execution of a refreshing process is delayed until the memory process is concluded. In the case of a simultaneous appearance of signals which precede a refreshing process and a memory process, a decision unit determines a sequence of execution of the processes.

9 Claims, 2 Drawing Figures

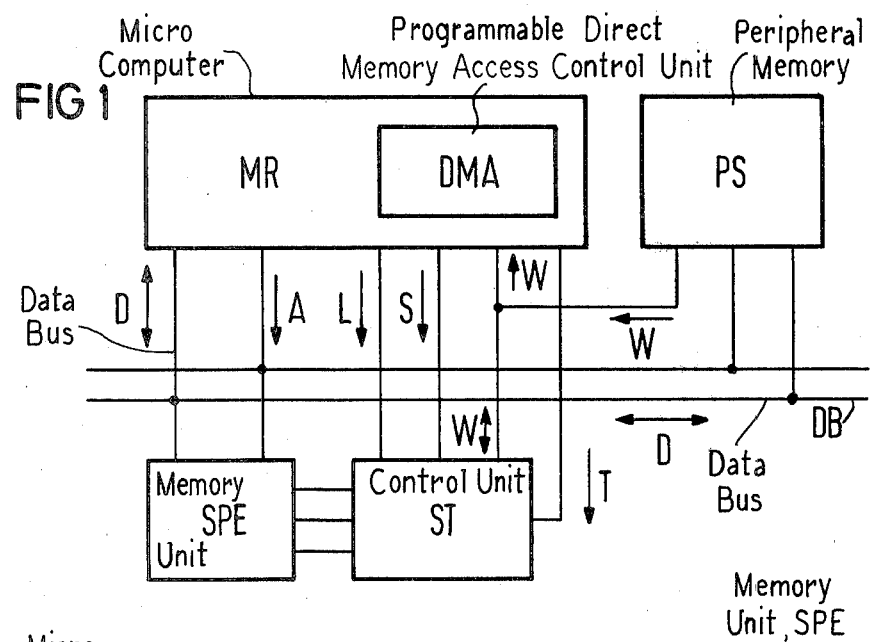
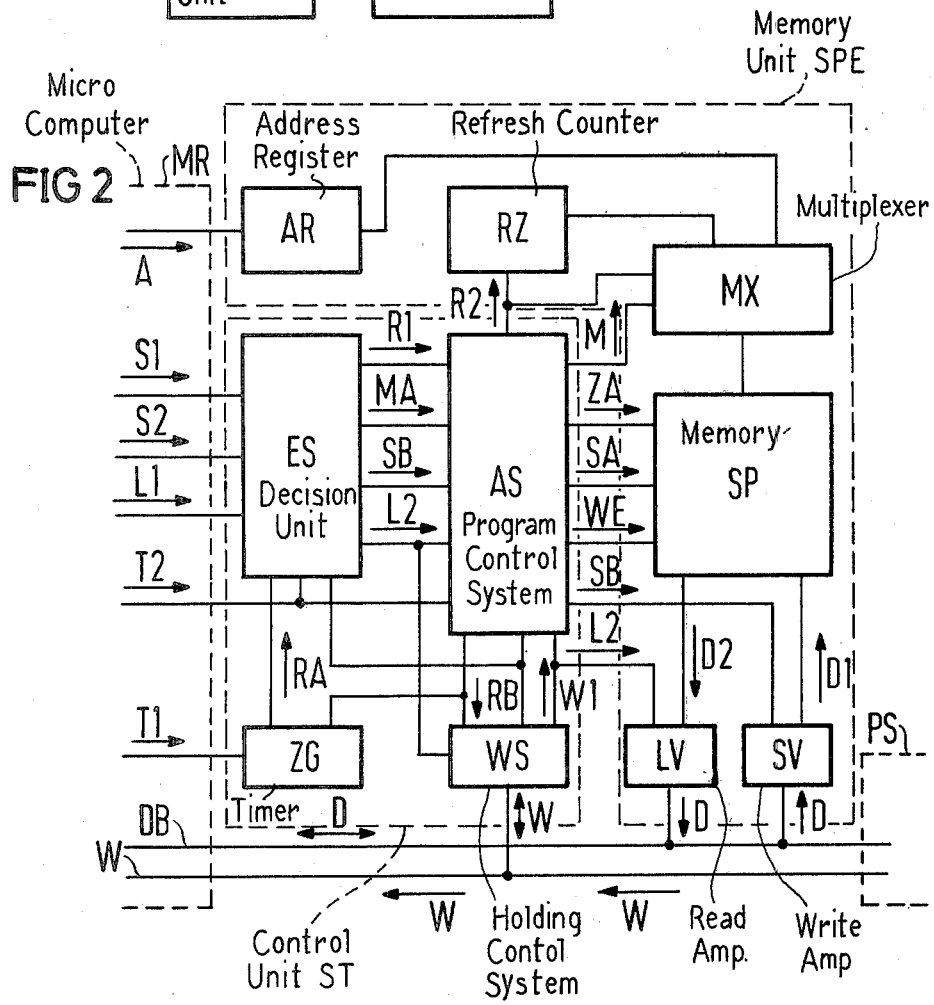

METHOD AND CIRCUITRY ARRANGEMENT FOR REFRESHING DATA STORED IN A DYNAMIC MOS MEMORY

BACKGROUND OF THE INVENTION

The invention refers to a method for refreshing data stored in a dynamic MOS memory whereby between memory processes which are triggered from a microcomputer or a programmable control unit for a direct storage access, like read or write processes, refreshing processes are inserted. With these processes, the data one after the other of a line of the memory are refreshed. The data of each line are refreshed at the latest after a predetermined duration. The invention further refers to a circuitry arrangement for execution of the above method.

Often static or dynamic MOS memories are used as working memories for microcomputer systems. In the case of static memories, the individual memory cell consists of a flip flop. In the case of dynamic memories, the memory cell is formed from a transistor and a capacitor of rather low capacity. The memory cell of a dynamic MOS memory manufactured as an integrated circuit requires a significantly smaller area, so that an approximately four-fold scale of integration is attained compared to a static MOS memory. From this, also significantly lower costs arise for a dynamic MOS memory. Also, the power requirement of a dynamic MOS memory is significantly lower. However, the dynamic MOS memory, compared to the static MOS memory, has a significant disadvantage. In the capacitors, due to discharge currents, a gradual loss of the stored charge occurs, and thus a loss of the stored data. In order to prevent this, the data must be refreshed at the latest after in each case a predetermined duration. This predetermined duration is, for example, 2 ms.

The memory cells of such MOS memories are customarily organized in matrix form. The addressing then proceeds thru line and column addresses. In the case of a reading process or in the case of applying the line addresses, simultaneously all cell contents of a line are refreshed. There exists on the one hand the possibility after the predetermined duration in each case for refreshing the data of all lines directly adjacent to one another, from the viewpoint of time. This process is designated as "burst refresh". On the other hand, there is the possibility of carrying out the refreshing processes in a distributed manner, so that between the refreshing processes of a line in each case, memory processes can be carried out. The duration after which a refreshing process must be carried out at the latest results from the quotient of the predetermined duration divided by the number of lines. This process is designated as "distributed refresh". When the memory is used as a working storage of a microcomputer system, the refreshing processes are customarily controlled by means of the microcomputer, in which after in each case a predetermined number of cycles of the microcomputer, a refreshing process is inserted for the memory.

The burst refresh has the disadvantage compared to the distributed refresh on the one hand that during the consecutive refreshing processes, all storage modules consume their working power dissipation, and that on the other hand, during this duration, a direct access to the memory by peripheral memories is not possible. Also in the case of a distributed refresh controlled by the microcomputer, an arbitrary memory access by a peripheral memory leads to great difficulties.

SUMMARY OF THE INVENTION

It is an object of the invention to provide a method for the refreshing of data stored in a dynamic MOS memory, which serves as a working memory of a microcomputer system, and to which access can be had at any time by a peripheral memory.

According to the invention, the problem in the case of the method of the kind previously described is solved in that the refreshing processes are carried out independently of the microcomputer; that the distributed refreshing processes proceed after in each case a duration which is shortened with respect to the predetermined duration by at least one duration which is associated to a memory process; that the execution of a reading process is delayed during a refreshing process until its conclusion; and that during a memory process, the execution of a refreshing process is delayed until the memory process is completed.

The method according to the present invention has the advantage that the processing velocity of the microcomputer is reduced only slightly by the refreshing processes, since only during the reading process can a delay take place by means of a refreshing process.

The method is suited in particular for use with a microcomputer which, in a duration which is larger than the duration required for a refreshing process before the introduction of a writing process, generates a corresponding writing signal when, along with the occurrence of the writing signal, a refreshing process which is just then proceeding is completely carried out and when following this, the actual writing process is carried out.

Only a slight expense is required for the delay of the reading process if, with the help of a holding or standby signal, the delay of the reading process proceeds by means of a holding cycle, during which the refreshing process which is just then in progress is completed.

For avoidance of a collision in time of a refreshing process and a memory process, it is advantageous if, in the case of a simultaneous appearance of signals which introduce a refreshing process and a memory process, the sequence of the execution of the processes is determined. In an advantageous circuitry arrangement for the execution of the method, a multiplexer is provided which, in the case of a memory process, connects through the line and column addresses of the specific cell to the memory; and in the case of a refreshing process connects through the line addresses stored in a counter to the memory. A program control system, which in dependence upon a signal generated in a timer brings about the refreshing process, releases to the multiplexer a signal which connects through the contents of the counter as a line address to the memory only when at that moment no memory process is being carried out. A holding or standby unit which releases a holding or standby signal to delay the execution of a reading process until the conclusion of the refreshing process just then in progress, brings about a holding cycle.

For the prevention of a time-related collision of a refreshing process and a memory process, it is advantageous if the decision unit in case of a simultaneous appearance of signals introducing a refreshing process and a memory process, releases the signals which are associated to the individual processes to the program control system one after another in time.

In order to be able to intermediately store the data to be written into the memory for a subsequent writing process as soon as they are characterized as valid, and in order to be able to hold them during a reading process until the end of the reading process, as soon as they are characterized as binding, it is advantageous when reading and writing amplifiers adjacent the data bus and connected with the memory are provided with intermediate memories in which the read data or respectively the data to be written in are intermediately storable.

In order to assure that the address of a memory cell is available during a complete writing process, even when the data on the data bus are no longer characterized as binding, it is advantageous when an address of a memory cell in each case is intermediately stored.

BRIEF DESCRIPTION OF THE DRAWINGS

FIG. 1 shows a block diagram of a memory unit which is connected to a microcomputer and an associated control unit; and FIG. 2 shows a block diagram of the memory unit and the control unit.

DESCRIPTION OF THE PREFERRED EMBODIMENTS

In the case of the block diagram presented in FIG. 1, a microcomputer MR is connected via a data bus D on the one side with a memory unit SPE, and on the other side with a peripheral memory PS. Further units can be connected to the data bus D, as for example input and output units or a read only memory. The microcomputer MR is designed in a known manner and encompasses a programmable DMA control unit (direct memory access) for a direct memory access which is obtainable commercially, for example under the designation 8257. Further, the microcomputer contains a clock generator which generates clock pulses T. Connected with the memory unit SPE is a control unit ST, which controls the time related progress of the memory processes, that is, the reading and writing processes. The memory unit SPE contains a dynamic MOS memory, the content of which must be refreshed at the latest after in each case a predetermined duration. These refreshing processes are also brought about by the control unit ST.

During a writing process, the microcomputer or the DMA control unit releases writing signals S, as well as an address A of a memory cell and the data to be read into the memory cell as data signals D. In a corresponding manner, the microcomputer or the DMA control unit during a reading process releases a signal which brings about the reading process as reading signal L and releases the address A of the memory cell, from which the data are to be read. The memory unit SPE then releases the data signals D to the data bus DB.

Between the memory processes, by means of the control unit ST, controlled refreshing processes are inserted with which the refreshing of the data stored in the memory unit SPE proceeds. The refreshing proceeds independently of the microcomputer MR between the individual memory processes. If during a refreshing process a reading process is to be introduced, the control unit ST generates a wait signal W, which brings about a wait cycle in the microcomputer MR or in the DMA control unit, and which delays the beginning of the reading process until the refreshing process is concluded. If during a refreshing process, a writing process is to be introduced, the refreshing process is first concluded and, following this, the writing process is carried out. Accordingly, the fact is utilized that known microcomputers and DMA control units generate a signal announcing the writing process before an actual process. The duration between this signal and the beginning of the actual writing process is larger than the duration required for a refreshing process.

When during a memory process, a refreshing process should be started, the memory process in each case is first completely concluded and following this, the refreshing process is carried out. A loss of stored data does not occur because the duration between two refreshing processes is dimensioned such that it is shorter than the predetermined maximum duration by the duration which is required for a memory process, for example, a writing process.

If a memory process and a refreshing process are to be simultaneously carried out, the control unit ST decides which process should be carried out first.

The memory in the memory unit SPE is organized in a matrix shape and a memory cell is called up by means of a corresponding line address and a corresponding column address. In the case of a refreshing process, the data in the memory are refreshed line by line. If, for example, the memory displays 128 lines and 128 columns, and if each memory cell must be refreshed at the latest after 2 ms, then in the case of the execution of the distributed refresh mentioned in the beginning, the result is that in each case one line must be refreshed after 15.6 $\mu$s. A refreshing process lasts approximately 550 ns, approximately just as long as a reading process. A writing process lasts approximately 1.7 $\mu$s. The predetermined maximum duration is now shortened at least by the duration of 1.7 $\mu$s which is required for the writing process. The refreshing processes repeat, for example, after each 12.5 $\mu$s. In this manner, in the case of a memory process which is just then in progress, the required refreshing process can be delayed up to 3 $\mu$s without having to worry about a loss of information in the memory.

Further details of the execution of the method will be specified in the following with the use of the block diagram portrayed in FIG. 2.

In the case of the block diagram shown in FIG. 2, the memory unit SPE is formed from the memory SP which is designed as a dynamic MOS memory, reading amplifiers LV, writing amplifiers SV, an address register AR, a refresh counter RZ and a multiplexer MX. The control unit ST consists of a decision unit ES, a program control system AS, a holding control system WS, and a timer ZG.

During the reading in of data into a memory cell of the memory SP, the address is transmitted from the microcomputer MR in the form of address signals A to the address register AR. The microcomputer MR releases a writing signal S1 which announces the writing process to the decision unit ES. Approximately 800 ns later, the microcomputer MR releases a further writing signal S2. The decision unit ES generates a signal MA which forms a memory request and a signal SB which indicates that it relates to a writing process. In dependence upon the signal MA, the program control system AS generates a signal M which is released to the multiplexer MX. Due to the matrix shaped organization of the memory SP, the multiplexer MX, in dependence upon the signal M, first connects through a first part of the address stored in the address register AR as a line address and following this, connects through a second part as a column address to the memory SP. The program control system releases to the memory a signal ZA which characterizes the line address and following this, releases a signal SA which characterizes the column address. The program control system AS switches the signal SB through the writing amplifier SV with which the data D which are adjacent to the data bus DB are taken over into the writing amplifier SV. The writing amplifier SV is provided with an intermediate memory in order to be able to intermediately store the data D during the total writing process. The data to be stored are data signals D1 adjacent to the memory SP. When the program control system AS generates a signal WE, the data represented by the data signals D1 are read into the corresponding memory cell of the memory SP.

During the reading of data from the memory SP, in a similar manner as in the case of writing, the address A of the memory cell is intermediately stored in the address register AR. The microcomputer MR generates a read signal L1, from which the decision unit ES generates a reading signal L2 and again a signal MA. The program control system AS in a similar manner as in the case of writing generates the signals M, ZA and SA, with which the memory cell in the memory SP is selected. The data which are read are released as data signals D2, and by means of the signal L2 are intermediately stored in the reading amplifier LV. At its output, the reading amplifier LV releases the data which have been read to the data bus DB.

The timer ZG, which is stepped forward by means of the clock pulse T1 after in each case 12.5 µs, generates a signal RA with which a refreshing process is announced. If at the same time no memory process, that is no writing or reading process is in progress, the decision unit ES generates a signal R1 which indicates to the program control system AS that now a refreshing process is to be carried out. The program control system AS releases a signal R2 to the multiplexer MX, so that this releases the content of the refresh counter RZ as a line address to the memory SP. Simultaneously, the signal ZA is released to the memory SP. With this, a line of the memory SP is called up and the content of this line is refreshed. Simultaneously, the program control system AS releases a signal RB to the holding unit WS to the timer ZG.

If during a refreshing process, a reading process is to be carried out which is indicated by the reading signal L1, the holding unit WS generates a holding signal W from the signals RB and L2, and releases it to the microcomputer MR. The microcomputer MR then prolongs the reading signal L1 by approximately 500 ns, which corresponds to a holding cycle of the microcomputer MR. During this time, the refreshing process is normally concluded. Following this, the signals RB, RA, R1, R2, M and ZA disappear. With the signal R2, the content of the refresh counter RZ is raised by one unit, so that during the next refreshing process, the next line in the memory SP is addressed. With the disappearance of the signal RA, the reading signal L1 becomes active, so that now the reading process as was described above can be carried out.

If during the refreshing process a writing process is to be carried out, first the writing signal S1 appears, which announces the writing process. The actual writing signal S2, as was previously stated above, appears only after approximately 800 ns, so that a refreshing process in progress can be concluded. The writing signal S1 nevertheless prevents the generation of further signals R1, in order not to introduce further refreshing processes. After the passage of the 800 ns, the writing process is carried out in the manner described above. Thus the writing process is not hindered or delayed by means of the refreshing process, since it can be carried out between the two writing signals S1 and S2.

In case the data during the writing signal S2 are not yet reliably present, because for example they cannot be released at the proper time from the peripheral memory PS, the peripheral memory PS generates a wait signal W, which is released to the program control system AS as signal W1 via the holding control system WS. The signal W1 blocks the writing process in the program control system AS until the holding signal W is no longer present. Following this, the data are written into the memory SP.

When the signal RA appears during a memory process in order to announce the execution of a refreshing process, the refreshing process is blocked until the memory process is concluded. During reading, this lasts approximately 550 ns, whereas during the writing process, the delay can amount to up to 1.7 µs. Since, however the signal RA appears in each case after a time of 12.5 µs and the maximum duration amounts to 15.6 µs, in each case the requirement is fulfilled that a refreshing process is carried out at the latest every 15.6 µs. In the case that for a writing process the peripheral memory PS is not yet ready for the release of data D and generates the holding signal W, the DMA control unit inserts holding cycles and delays the writing signal S2. These holding cycles are evaluated with the signal W in the holding control system WS. With the signal W1, in the program control system AS, the signal MA is blocked and the signal R1 is released and therefore, during the holding cycles, also a refreshing process can be carried out. When the holding signal W disappears, the signal R1 is blocked and the signal MA becomes active and a writing process can be carried out.

In the case of a simultaneous appearance of signals S1 or L1 announcing a memory process and the signal RA, the decision unit ES determines which process will be carried out first. This can take place statically by means of an interlocking of the signals and/or by means of evaluation of the signals with varying clockpulse durations (start and stop times) of high frequency clockpulses T2. Here also, in each case it is assured that after 15.6 µs at the latest, again a refreshing process will be carried out.

The block diagrams of FIGS. 1 and 2 can be implemented in the following manner by those skilled in this art. The microcomputer MR is obtainable under the designation Integrated Circuit type 8080 of Intel Corp., Santa Clara, Calif. The counter RZ, the multiplexer MX, the decision stage ES, the program control system AS, and the time generator ZG may be contained in an Intel integrated circuit type 8280. The control unit BNA may be integrated circuit type 8257 of Intel. The peripheral memory PS is, for example, a floppy disk unit as is well known in the art. The memory SP is constructed of memory modules 2116 of INTEL. The holding control system WS is constructed very simply and it consists of two JK flip-flops as a delay stage. At the clock pulse input of the first flip-flop are the clock pulses T1. At the J input and the inverted $\bar{K}$ input is the signal W. At its Q output, the first flip-flop releases the signal W1. At the clock pulse input of the second flip-flop is the signal L2, while at the J input the signal RB is present. At the Q output, the second flip-flop releases the signal W. Also, the signal W1 is present at the C of the second flip-flop. As stated previously, the second flip-flop is set when during a regenerating or refreshing process, a reading process is to be carried out and the signals L2 and RB appear. Besides this, as also discussed previously, the signal W1 is generated when the delay or wait signal W appears. With the signal W1, a writing process is blocked in the holding control system AS until the delay or wait signal is no longer present.

The reading amplifier LV and the writing amplifier SV are in each case formed from flip-flop modules which are obtainable under the designation 74LS373 from Texas Instruments, Dallas, Tex.

For stage WS, flip-flop modules 74LS112 or 74LS109 from Texas Instruments may be employed.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A method for refreshing data stored in a dynamic MOS memory, comprising the steps of:
   providing a control means for reading or writing memory processes which read or write data in said MOS memory;
   performing a distributed refreshing process by sequentially refreshing the memory line-by-line by successive refreshing processes, each line being refreshed prior to expiration of a shortened time duration which is shorter than a predetermined time duration related to a total time duration for refreshing the entire memory divided by the number of lines in the memory;
   said shortened time duration corresponding to the predetermined time duration being shortened by a time duration of a reading or writing memory process for reading or writing in one line of the memory;
   executing each refreshing process independently of the memory processes;
   delaying execution of a reading memory process for one line during a refreshing process for the line and until its conclusion; and
   delaying a refreshing process of a line until a reading or writing memory process for the line is concluded.

2. A method according to claim 1 wherein a time duration which is larger than the duration required for a refreshing process, before an actual writing memory process a writing signal is generated, and with appearance of the writing signal a refreshing process just then in progress is executed to completion, and following this the actual writing memory process is executed.

3. A method according to claim 1 wherein with the help of a wait signal delay of the reading memory process occurs for a wait cycle during which time the refreshing process which in each case is just then in progress is concluded.

4. A method according to claim 1 wherein if a simultaneous appearance of signals which introduce a refreshing process and a memory process occurs, a sequence of execution of the refreshing and memory processes is determined.

5. A method according to claim 1 wherein said control means includes a microcomputer for direct memory access of the memory.

6. A system for refreshing data stored in a dynamic MOS memory, comprising:
   a dynamic MOS memory having a plurality of memory cells accessed by line and column addressing;
   a control means for generating reading or writing memory processes which read or write data in said MOS memory;
   distributed refreshing process means for performing a distributed refreshing process by sequentially refreshing the memory line-by-line by successive refreshing processes;
   said refresh processing means including
   a refresh counter means for generating line addresses for refreshing,
   a timer means for timing the refreshing process,
   a multiplexer means for connecting through during a memory process the line and column address of a specific memory cell and which in the case of a refreshing process connects through the line address stored in said refresh counter to the memory,
   a program control means for initiating in dependence upon a signal generated in said timer means a refreshing process, said program control means releasing to the multiplexer means a signal which connects through contents of the refresh counter means as a line address to the memory only when no memory process is being executed, and
   a holding unit means for releasing a holding signal which delays execution of a reading process until conclusion of the refreshing process just then in progress, said holding signal initiating a holding cycle.

7. A system according to claim 6 wherein a decision unit means is provided for releasing to said program control means signals associated to the individual refreshing and memory processes, one after the other in time, when a simultaneous appearance of signals introducing a refreshing process and a memory process occurs.

8. A system according to claim 6 wherein reading and writing amplifier means are provided which are connected with the MOS memory and which are provided with intermediate memories in which the read data, or respectively, the data to be written in, are intermediately storable.

9. A system according to claim 6 wherein an address register means is provided in which in the case of a memory process, the address of a memory cell in each case is intermediately storable.

* * * * *